United States Patent [19]

Hikita et al.

[11] Patent Number: 5,740,729
[45] Date of Patent: Apr. 21, 1998

[54] PRINTING APPARATUS AND METHOD FOR INSPECTING PRINTED MATERIALS

[75] Inventors: Osamu Hikita; Syoji Sato, both of Neyagawa; Toshinori Mimura, Moriguchi; Kazue Okanoue, Kadoma; Youichi Nakamura, Katano, all of Japan

[73] Assignee: Matsushita Electric Industrial Co., Ltd., Osaka-fu, Japan

[21] Appl. No.: 536,262

[22] Filed: Sep. 29, 1995

Related U.S. Application Data

[63] Continuation of Ser. No. 247,235, May 23, 1994, abandoned.

[30] Foreign Application Priority Data

May 21, 1993 [JP] Japan .................... 5-118892

[51] Int. Cl.$^6$ .................... B41M 1/12; B41M 1/34; B41F 15/18
[52] U.S. Cl. .................... 101/126; 101/129; 101/484; 118/688; 118/713; 427/9; 427/10
[58] Field of Search .................... 101/41, 44, 114, 101/115, 126, 128, 129, 474, 484; 427/8–10, 96; 118/713, 688

[56] References Cited

U.S. PATENT DOCUMENTS

| | | | |
|---|---|---|---|
| 3,543,679 | 12/1970 | Wahl | 101/126 |
| 4,814,198 | 3/1989 | Baecklund | 427/9 |
| 4,945,829 | 8/1990 | Ericsson | 101/129 |
| 4,953,459 | 9/1990 | Ericsson | 101/129 |
| 4,981,074 | 1/1991 | Machita et al. | 101/126 |
| 5,108,024 | 4/1992 | Kazem-Goudarzi et al. | 118/713 |
| 5,134,932 | 8/1992 | Fujino | 101/484 |
| 5,226,361 | 7/1993 | Grant et al. | 101/44 |
| 5,232,736 | 8/1993 | Tribbey et al. | 427/96 |

FOREIGN PATENT DOCUMENTS

| | | | |
|---|---|---|---|
| 259776 | 3/1988 | European Pat. Off. | 101/126 |
| 14956 | 1/1986 | Japan | 101/129 |
| 13802 | 1/1990 | Japan . | |
| 347637 | 12/1992 | Japan | 101/126 |
| 1115115 | 9/1984 | U.S.S.R. | 101/126 |
| 1564003 | 4/1980 | United Kingdom | 101/129 |

*Primary Examiner*—Stephen R. Funk
*Attorney, Agent, or Firm*—Wenderoth, Lind & Ponack

[57] ABSTRACT

In a printing apparatus and method, printing material is printed on to-be-printed circuit boards in a predetermined pattern and a printing state of the material is inspected. The apparatus includes the following devices. A board supporting device has a rotary body supporting a plurality of board-fixed tables to which the boards are secured, and turns the rotary body together with the board-fixed tables intermittently at predetermined angular intervals so as to stop the board-fixed tables at each of a fixing, recognizing, printing, and inspecting position. A board feed device feeds the boards to the board-fixed tables arranged at the fixing position. A board discharge device discharges the boards from the board-fixed tables arranged at the fixing position. A recognizing device recognizes fixed positions of the boards relative to the board-fixed tables at the recognizing position. A printing device prints the printing material on the boards at the printing position. An inspecting device inspects the printing state of the boards at the inspecting position. The method carries out the board-feeding, position recognizing, printing, printing-state-inspecting, and board-discharging operations by use of the corresponding devices.

13 Claims, 9 Drawing Sheets

Fig. 5 - PRIOR ART
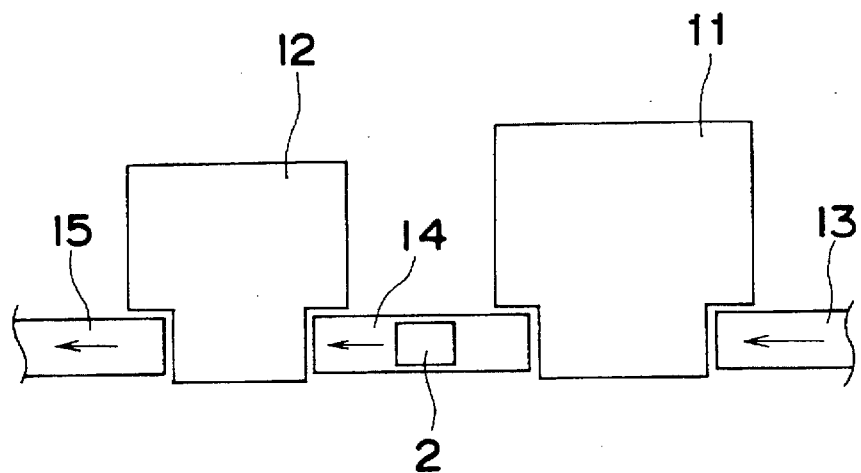
Fig. 6 - PRIOR ART
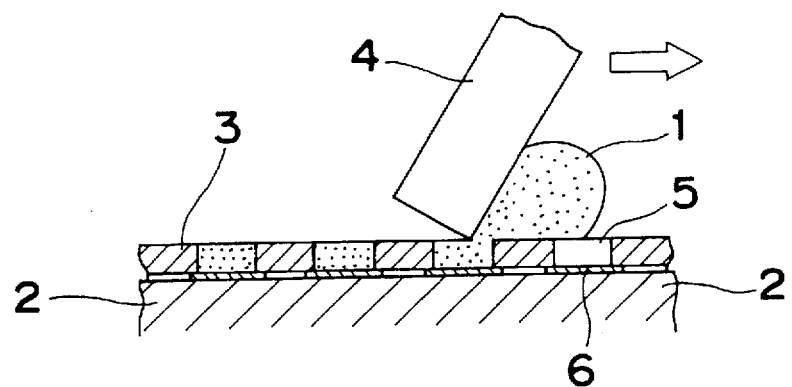
Fig. 7 - PRIOR ART
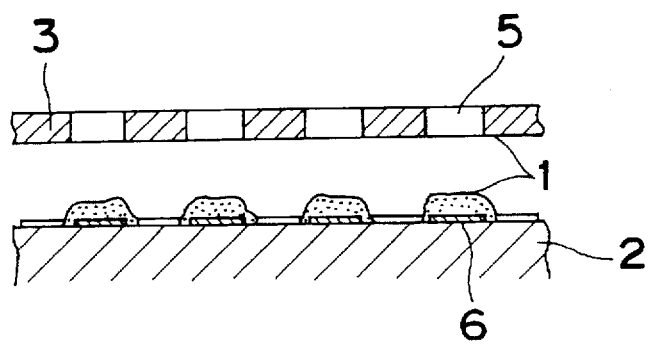

PRINTING APPARATUS AND METHOD FOR INSPECTING PRINTED MATERIALS

This application is a Continuation application of now abandoned application, Ser. No. 08/247,235, filed May 23, 1994.

BACKGROUND OF THE INVENTION

The present invention relates to an apparatus and a method for printing various kinds of printing material such as a cream solder, a conductive paste, an insulating paste, etc. onto a surface, and further inspecting the printing state.

In manufacturing, for example, electronic circuit boards, a cream solder has been generally used to solder chips or the like electronic components onto a circuit board, and a cream solder printing apparatus has been employed for this purpose to print and apply the cream solder in a predetermined pattern.

As shown in FIG. 5, a conventional cream solder printing apparatus consists of a printer 11 for printing and applying a cream solder onto a circuit board 2 and an inspecting device 12 for recognizing the printing state of the printed circuit board 2. Before and after the printer 11 and the inspecting device 12 in the transfer direction of the board 2, a feed device 13, a transfer device 14 and a discharge device 15 are provided respectively to feed the circuit board 2 to the printer 11, to send the printed board 2 from the printer 11 to the inspecting device 12, and to discharge the printed board 2 from the inspecting device 12.

In the printer 11, the circuit board 2 carried in by the feed device 13 is supplied onto a board-fixed table (not shown) within the printer 11, and after being fixed to the table and positioned at a predetermined position of the table, the circuit board 2 is moved within the printer 11 so that a cream solder is printed and applied thereto.

In FIGS. 6 and 7, while a mask 3 is positioned and superposed over the circuit board 2, a squeegee 4 is pressed against the mask 3 with a suitable pressure and is linearly moved to fill the cream solder 1 into openings 5 of the mask 3. The mask 3 is then separated from the circuit board 2. In the above manner, the cream solder 1 is printed and applied onto the circuit board 2 via the mask 3 in a predetermined pattern. Specifically, the cream solder 1 is printed on lands 6 of the circuit board 2.

The printed board 2 is subsequently fed to the transfer device 14, discharged from the printer 11 and fed to the inspecting device 12. The printed board 2 is transferred to a board-fixed table (not shown) in the inspecting device 12, where the printed board 2 is fixed to the board-fixed table and positioned at a predetermined position. In this state, the printed board is moved to a predetermined inspecting position to inspect the printing state by a laser recognition device or the like (not shown). After the inspection, the printed board 2 is transferred to the discharge device 15 for treatment in accordance with the results of the inspection.

During continuous printing of the cream solder, the cream solder 1 invades and adheres to the rear face of the mask 3, and therefore the mask 3 is suitably cleaned to remove the adhering cream solder 1.

In the conventional arrangement of the printing apparatus as above, since the printed circuit board 2 is transferred in and out by the devices 13–15 before and after it is processed in the printer 11 and inspecting device 12, the operation time is increased, which leads to low productivity. At the same time, more space is required for the devices 13–15. When the printed board 2 after being printed by the printer 11 is transferred by the transfer device 14 to the inspecting device 12, positioning of the printed board 2 must be carried out again at the inspecting device 12, and thus, the positioning accuracy is decreased.

SUMMARY OF THE INVENTION

The object of the present invention is therefore to provide an apparatus and a method for printing circuit boards and inspecting the printing state thereof without lowering the productivity or the positioning accuracy of the printed boards and without requiring a large space.

In accomplishing these and other objects, according to a first aspect of the present invention, there is provided a printing apparatus for printing a printing-material on to-be-printed circuit boards (hereinafter referred to as "circuit boards" or "boards" both before and after printing thereon) in a predetermined pattern and inspecting a printing state of the material, comprising:

a board supporting device, which has a rotary body supporting a plurality of board-fixed (or board-securing) tables to which the boards are secured, for turning the rotary body together with the board-fixed tables intermittently at predetermined angular intervals and stopping the board-fixed tables at a plurality of stopping positions including a fixing position, a recognizing position, a printing position, and an inspecting position;

a board feed device for feeding the boards to the board-fixed tables arranged at the fixing position;

a board discharge device for discharging the boards from the board-fixed tables arranged at the fixing position;

a recognizing device for recognizing fixed positions of the boards relative to the board-fixed tables at the recognizing position;

a printing device for printing the printing material on the boards at the printing position; and an inspecting device for inspecting the printing state of the boards at the inspecting position.

According to a second aspect of the present invention, there is provided a printing apparatus for printing-material on boards in a predetermined pattern and inspecting a printing state of the material, comprising:

board-fixed tables including moving bodies which are independently movable on a fixed plane and capable of being positioned at an optional position and to which the boards are secured;

a board feed device for feeding the boards to the board-fixed tables;

a board discharging device for discharging the boards from the board-fixed tables;

a recognizing device for recognizing fixed positions of the boards relative to the board-fixed tables;

a printing device for printing the printing material on the boards fixed to the board-fixed tables; and an inspecting device for inspecting the printing state of the boards secured to the board-fixed tables.

According to a third aspect of the present invention, there is provided a printing method for printing printing-material on circuit boards in a predetermined pattern and inspecting a printing state of the material, the method utilizing a board supporting device having a rotary body supporting a plurality of board-fixed tables to which the boards are secured, the method comprising the steps of:

turning the rotary body together with the board-fixed tables intermittently at predetermined angular intervals and stopping the board-fixed tables at a plurality of stopping positions including a fixing position, a recognizing position, a printing position, and an inspecting position;

feeding the boards to the board-fixed tables arranged at the fixing position by use of a board feed device;

recognizing fixed positions of the boards relative to the board-fixed tables at the recognizing position by use of a recognizing device;

printing the printing material on the boards at the printing position by use of a printing device;

inspecting the printing state of the boards at the inspecting position by use of an inspecting device; and discharging the boards from the board-fixed tables arranged at the fixing position by use of a board discharge device.

According to a fourth aspect of the present invention, there is provided a printing method for printing printing-material on boards in a predetermined pattern and inspecting a printing state of the material, the method utilizing board-fixed tables including moving bodies which are independently movable on a fixed plane and capable of being positioned at an optional position and to which the boards are secured, the method comprising the steps of:

feeding the boards to the board-fixed tables by use of a board feed device;

recognizing fixed positions of the boards relative to the board-fixed tables by use of a recognizing device;

printing the printing material on the boards fixed to the board-fixed tables by use of a printing device;

inspecting the printing state of the boards secured to the board-fixed tables by use of an inspecting device; and discharging the boards from the board-fixed tables by use of a board discharging device.

BRIEF DESCRIPTION OF THE DRAWINGS

These and other objects and features of the present invention will become clear from the following description taken in conjunction with the preferred embodiments thereof with reference to the accompanying drawings, in which:

FIG. 5 is a schematic plan view of a conventional cream solder printing apparatus;

FIGS. 6 and 7 are schematic sectional views illustrating a conventional printing method of a cream solder;

DETAILED DESCRIPTION OF THE PREFERRED EMBODIMENTS

Figure 1:
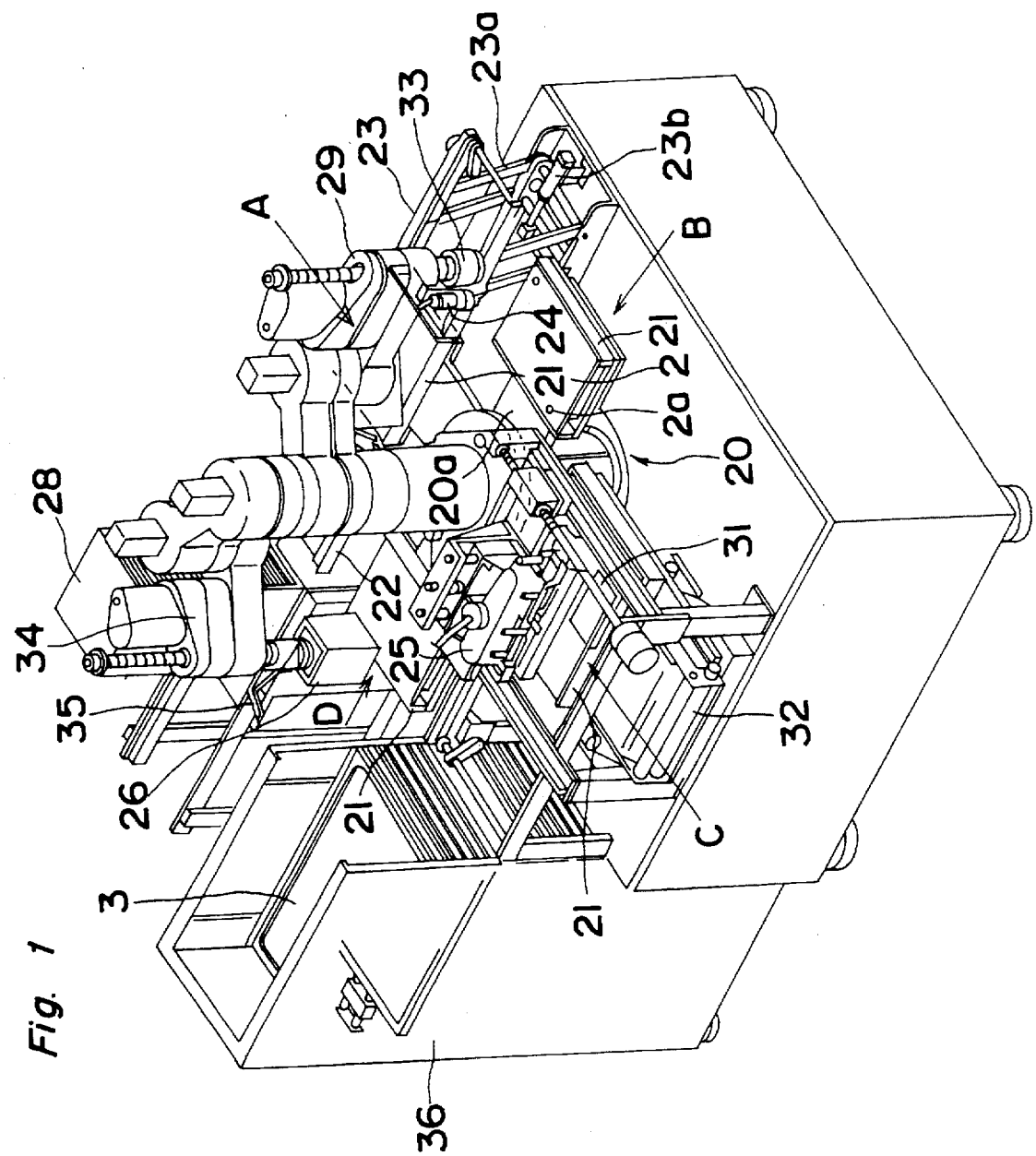
FIG. 1 is a perspective view of the whole of a cream solder printing apparatus in a first embodiment of the present invention.

Before the description of the present invention proceeds, it is to be noted that like parts are designated by like reference numerals throughout the accompanying drawings.

The present invention will be described below with reference to the accompanying drawings in which parts having the same function as the conventional parts are designated by the same reference numerals, and the description thereof will be abbreviated.

FIG. 1 is a perspective view of the whole cream solder printing apparatus according to a first embodiment of the present invention.

In the cream solder printing apparatus of FIG. 1, four board-fixed (or board-securing) tables 21, to which circuit boards 2 serving as printed boards to be printed are fixed, are provided in the periphery of a rotary body 20a of a board supporting device 20. The board supporting device 20 stops the board-fixed tables 21 at four positions (fixing position A, recognizing position B, printing position C, and inspecting position D) by turning the rotary body 20a intermittently at angular intervals of 90° about the vertical axis. The cream solder printing apparatus further includes a feed device 22 and a discharge device 23 for feeding a circuit board 2 to the board-fixed table 21 and discharging the board 2 from the board-fixed table 21 at the fixing position A, a position recognizing device 24 comprising a camera for recognizing the fixed position of the circuit board 2 relative to the board-fixed table 21 at the recognizing position B, a printing device 25 for printing a printing material on the circuit board 2 at the printing position C, and an inspecting device 26 for inspecting the printing state of the printed board 2 at the inspecting position D.

Each board-fixed table 21 has a stopper to stop the circuit board 2 sent by the feed device 22 at a predetermined position, and also positioning pins which are freely moved up and down to be inserted in and out of positioning holes formed in the circuit board 2. When the positioning pins are inserted into the above holes of the circuit board 2 to thereby position the circuit board 2 to some extent, suction is applied to the circuit board 2 by a built-in suction device from the rear face thereof so as to securely position the circuit board 2. After the circuit board 2 is sucked and fixed to the board-fixed table 21, the positioning pins are removed from the holes of the circuit board 2. The board-fixed table 21 can correct the fixing position of the circuit board 2 so as to allow a fixing part of the circuit board 2 to slightly move in the X and Y directions and in a predetermined rotating direction.

The feed device 22 and the discharge device 23 are adapted to sway via a parallel link mechanism 23a (only the portion of the mechanism at the side of the discharge device 23 is shown in the drawing). Both devices 22, 23 are controlled to be separated from the fixing position A so as to not hinder the turning movement of the board-fixed table 21. Reference numeral 23b is a cylinder which moves the discharge device 23 in directions toward and away from the board-fixed table 21, and reference numeral 28 is a storing device which can accommodate a plurality of circuit boards 2.

A pattern 2a, e.g., a circle or a square, is formed on the circuit board 2 for use in recognizing the position of the board 2. The position of the circuit board 2 relative to the board-fixed table 21 is obtained by detecting the pattern 2a from the image-pick-up data by use of the recognizing device 24. The recognizing device 24 is moved within the horizontal plane by a first robot device 29 which is supported at the base thereof coaxially with the rotary body 20a of the supporting device 20.

The printing device 25 includes a squeegee head, a mask 3, and the like disposed above the printing position C. The printing device 25 fills cream solder through openings of the mask 3 placed on the circuit board 2 at the printing position C to thereby print and apply the cream solder onto the board 2 in a predetermined pattern. In the first embodiment, the board-fixed table 21 is allowed to move up and down only at the printing position C. For printing, the board-fixed table 21 holding the circuit board 2 is raised up and down by a lift device 31 below the printing position C, so that the circuit board 2 is brought in touch with and out of touch from the mask 3 above the printing position C.

A cleaning paper feed device 32 is provided below the printing position C to clean the mask 3. An ultrasonic oscillator 33 for vibrating the mask 3 with ultrasonic waves is provided on the first robot device 29 to clean the mask 3. After printing is performed a suitable number of times, if the recognizing device 24 recognizes that the mask 3 is clogged, the rotary body 20a of the supporting device 20 is rotated 45° to allow for cleaning of the mask 3 at that position. This prevents the circuit board 2 or the board-fixed table 21 from interfering with the mask 3 or cleaning device during cleaning.

The inspecting device 26 is comprised of a laser transmitter/receiver which can be moved in three dimensions by a second robot device 34. Accordingly, based on the principle of the trigonometrical survey, the cream solder on the circuit board 2 can be inspected in the applied area in three dimensions, namely, the printing position shift amounts of the cream solder in the X and Y directions, the rotary position shift amount thereof in the θ direction, the area value and volume value per printing pad, and the thickness value of the printed film. An engagement hook 35 of the second robot device 34 engages a predetermined mask 3 from a mask stocker 36 and mounts the same at the printing position C when it is desired to change the kind of printed boards 2 to be produced.

Figure 8:
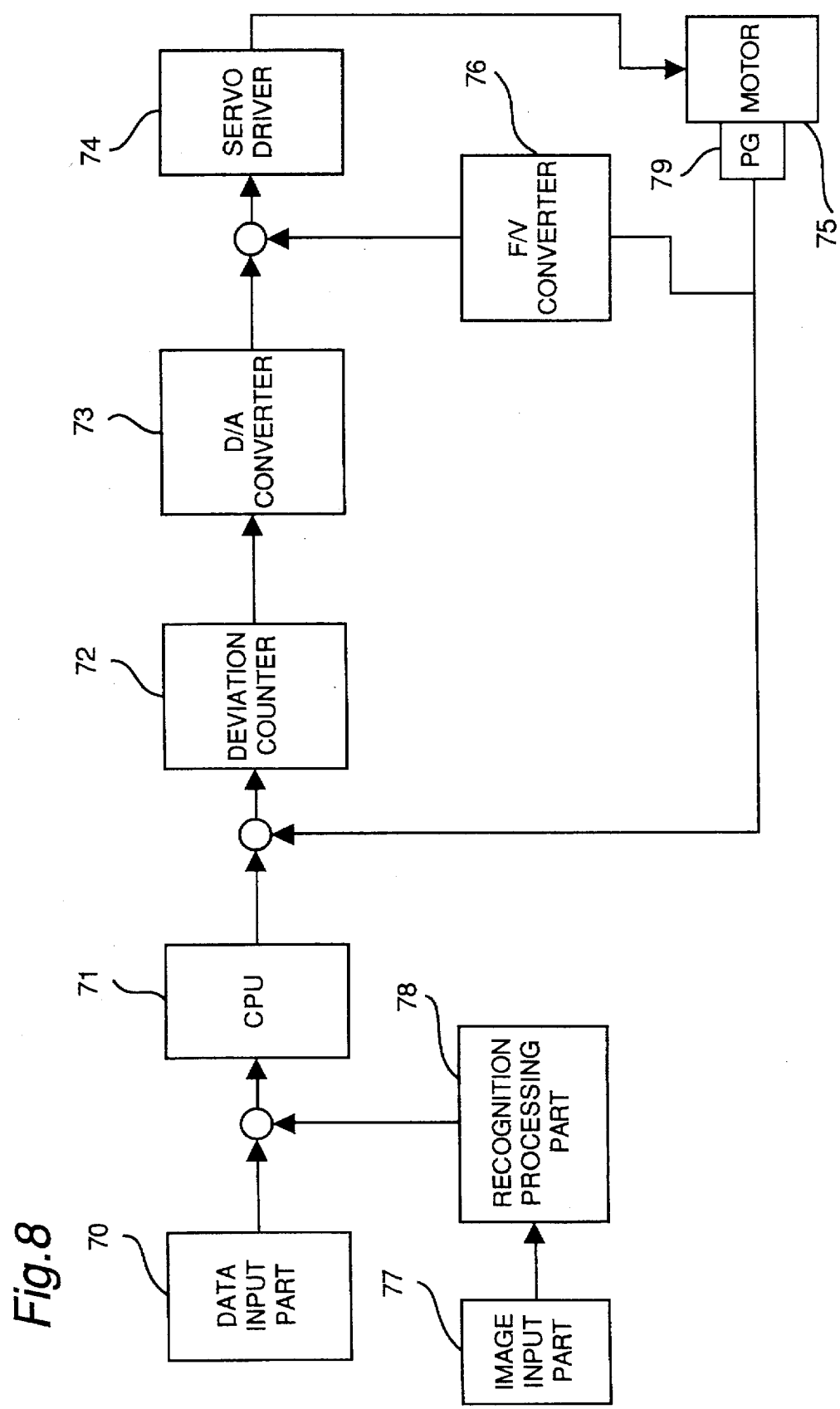
FIG. 8 is a block diagram showing the controlling part of the apparatus.

FIG. 8 shows a block diagram of the controlling part. The controlling part includes a CPU 71, a data input part 70, an image input part 77, a recognition processing part 78, a deviation counter 72, a D/A converter 73, a servo driver 74, a motor 75 with a rotary encoder 79, and an F/V converter (frequency-to-voltage converter) 76.

The motor 75 drives the board-fixed table 21, the first robot device 29, and the second robot device 34. The rotary encoder 79 is arranged on the same axis of the rotary shaft of the motor 75 and outputs current values to the deviation counter 72 and the F/V converter 76 to make a feedback control loop. Values based on CAD data and instructed data are previously inputted to the CPU 71 through the data input part 70. The image input part 77 is composed of a camera and a CCD image-pick-up device and inputs image-pick-up data into the recognition processing part 78 and thereby the recognition processing part 78 recognizes the image data and transforms the image data into positional data on a coordinate to input the positional data into the CPU 71. The CPU 71 performs data processing based on the data outputted from the data input part 70 and the recognition processing part 78. The deviation counter 72 outputs data indicating differences between an instruction value processed by the CPU 71 and indicating a movement for control and a current value outputted from the rotary encoder 79 through the feedback control loop. The D/A converter 73 converts digital data outputted from the deviation counter 72 into analog data. The servo driver 74 drives the motor 75 based on the data outputted from the D/A converter 73 and the F/V converter 76. The F/V converter 76 converts feedback data outputted from the rotary encoder 79 into a feedback data of a speed to input into the servo driver 74 to perform the feedback control.

The above controlling part is used and feedback-controlled based on detected data in each of the board supporting device 20, the board-fixed table 21, the position recognizing device 24, the printing device 25, the inspecting device 26, the first robot device 29, and the second robot device 34.

Figure 14:
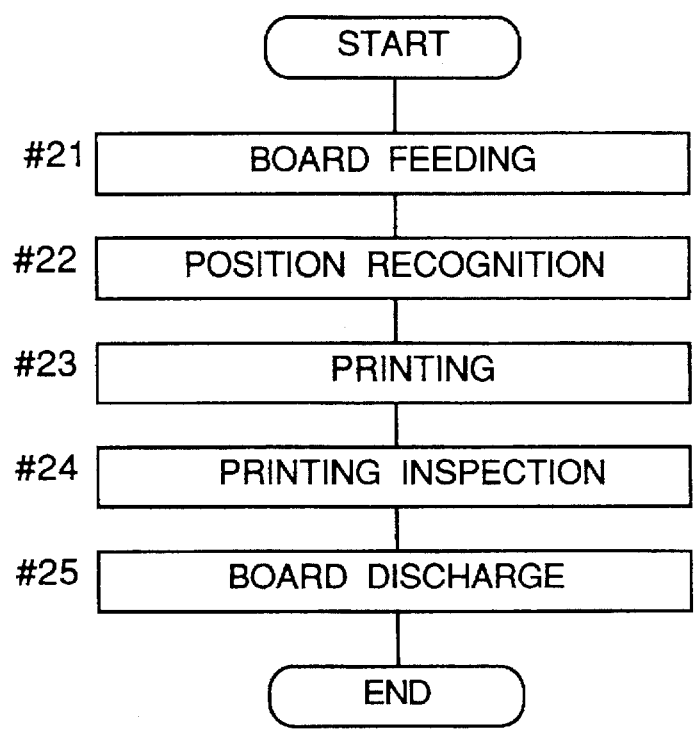
FIG. 14 is a flow chart showing a printing method according to the embodiment of the present invention.

In the above arrangement, the printing method of the embodiment of the present invention is carried out as follows, as shown in FIG. 14.

First, the circuit board 2 carried into the fixing position A by the feed device 22 is transferred onto the board-fixed table 21 at the fixing position A and secured to the board-fixed table 21 (a board feeding step #21 in FIG. 14).

Thereafter, the rotary body 20a of the supporting device 20 is turned 90°, whereby the board-fixed table 21 at the fixing position A is moved to the recognizing position B. The patterns 2a of the circuit board 2 are recognized by the recognizing device 34 at the recognizing position B, and the position of the circuit board 2 relative to the board-fixed table 21 is detected (a position recognizing step #22 in FIG. 14).

The rotary body 20a is turned another 90° and the board-fixed table 21 at the recognizing position B is moved to the printing position C. At this time, the fixing position of the circuit board 2 on the board-fixed table 21 is corrected to agree with the mask 3 of the printing device 25 based on the data detected by the recognizing device 34. When the circuit board 2 reaches the printing position C, the circuit board 2 along with the board-fixed table 21 is raised by the lift device 31 to be tightly held in touch with the mask 3. The cream solder is applied onto the circuit board 2 through the openings of the mask 3 by the printing device 25. When printing of the cream solder is finished, the circuit board 2 and the board-fixed table 21 are moved down by the lift device 31. The printed board 2 is separated from the mask 3 (a printing step #23 in FIG. 14).

Next, as the rotary body 20a of the supporting device 20 turns 90°, the board-fixed table 21 at the printing position C is sent to the inspecting position D. At the inspecting position D, the printing state of the board 2 is recognized and inspected by the inspecting device 26 and evaluated by the controlling part as to whether it is within a preset range (an inspecting step #24 in FIG. 14).

Figure 9:
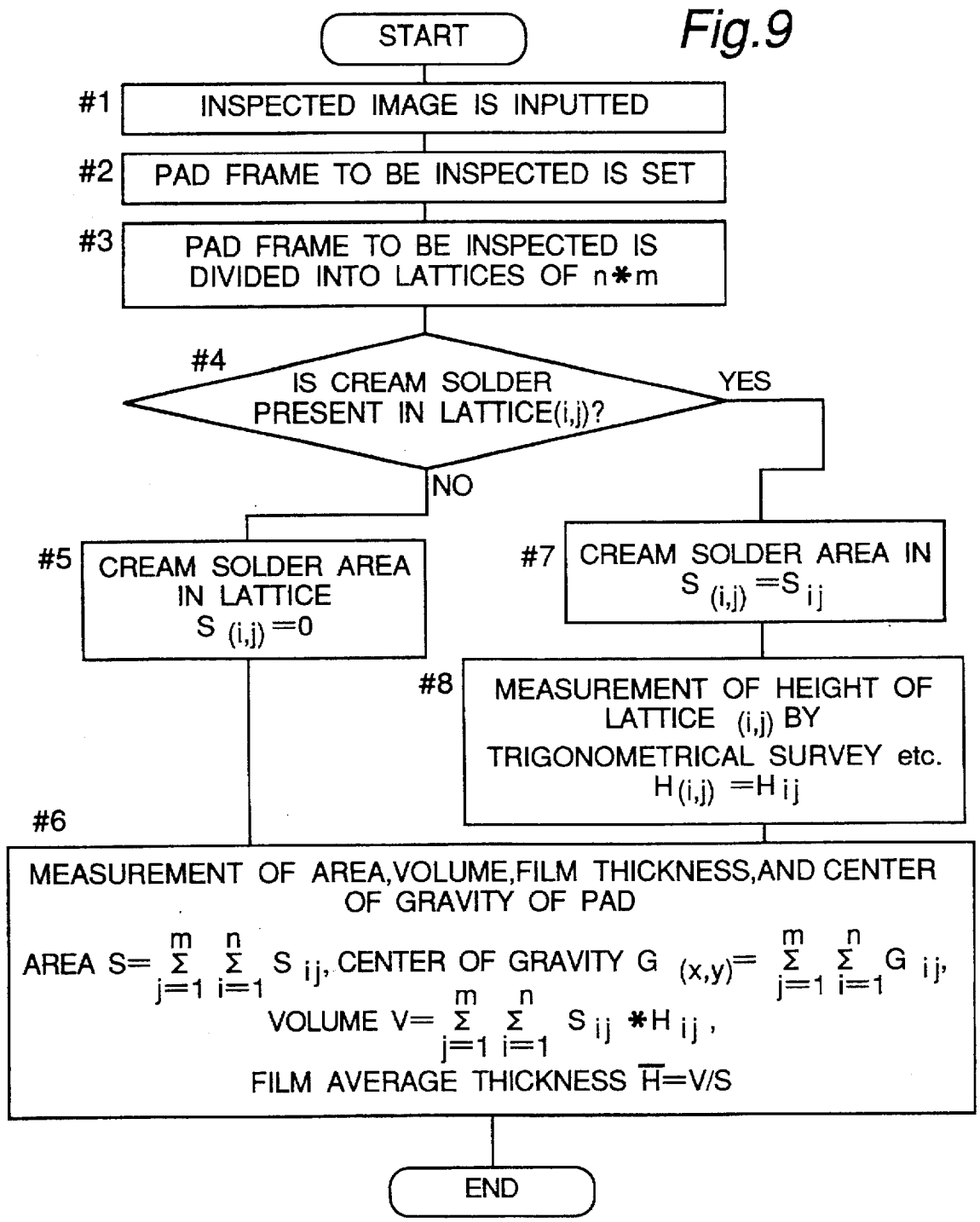
FIG. 9 is a flow chart showing one example of an inspecting method in the apparatus.
Figure 10:
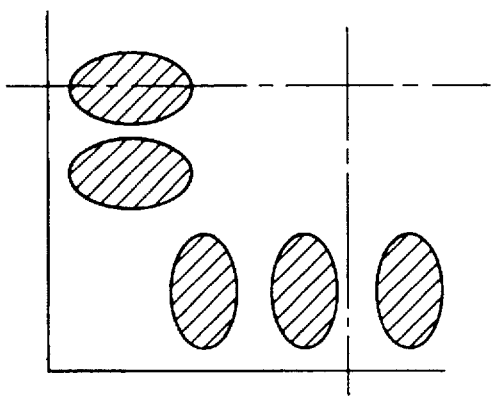
FIGS. 10, 11, and 12 are explanatory diagrams showing the steps #1, 2, and 3.
Figure 11:
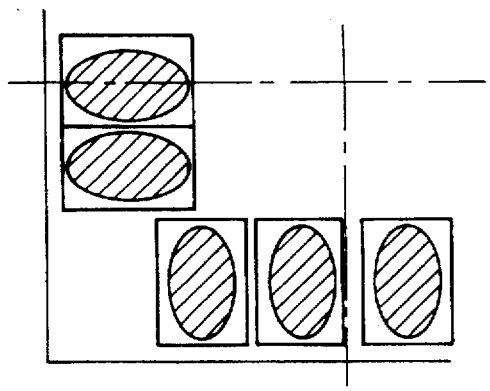
Figure 12:
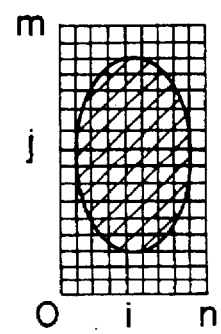

The inspection of the printing state of the circuit board 2 is measured in a manner, for example, shown in FIG. 9. At step #1, inspected data of the printed cream solder pad to be inspected is inputted as shown in FIG. 10. Then, at step #2, a pad frame to be inspected is previously set as shown in FIG. 11. At step #3, based on the dimension of the pad frame, the pad to be inspected is measured in the following manner as shown in FIG. 12. At step #3, the lattice which has a size larger than the resolution which is capable of being measured is set within the pad frame. The pad to be inspected is divided into lattices of n*m based on the dimension of the set lattice. At step #4, it is decided whether or not the cream solder is present in the lattice (i,j) through the inspecting operation. If the cream solder is not present in the lattice at step #4, the cream solder area in the lattice is set as $S(i,j)=0$ at step #5. On the other hand, if the cream solder is present in the lattice at step #4, the cream solder area in the lattice is set as $S(i,j)=S_{ij}$ at step #7. The value of $S_{ij}$ corresponds to the area of the cream solder in the lattice. At step #8, the use of the trigonometrical survey etc. allows the height $H_{ij}$ of the lattice to be measured and then the volume $V_{ij}$ of the lattice is expressed by the following expression:

$$V_{ij} = S_{ij} * H_{ij}.$$

Thus, after the predetermined operations carried out at the step #5 or #8, at step #6, the area value S and volume value V of the cream solder in the pad to be inspected is expressed as follows:

$$S = \sum_{j=1}^{m} \sum_{i=1}^{n} S_{ij}$$

$$V = \sum_{j=1}^{m} \sum_{i=1}^{n} S_{ij} * H_{ij}$$

Then, the film average thickness $\bar{H}$ of the pad is expressed by: $\bar{H} = V/S$.

Since the presence of the cream solder in the lattice (i,j) is already decided, the center of gravity $G(x,y)$ in the pad can be calculated by the center of gravity of the whole from the center of gravity of each lattice.

$$G(x,y) = \sum_{j=1}^{m} \sum_{i=1}^{n} G_{ij}(x,y)$$

Figure 13:
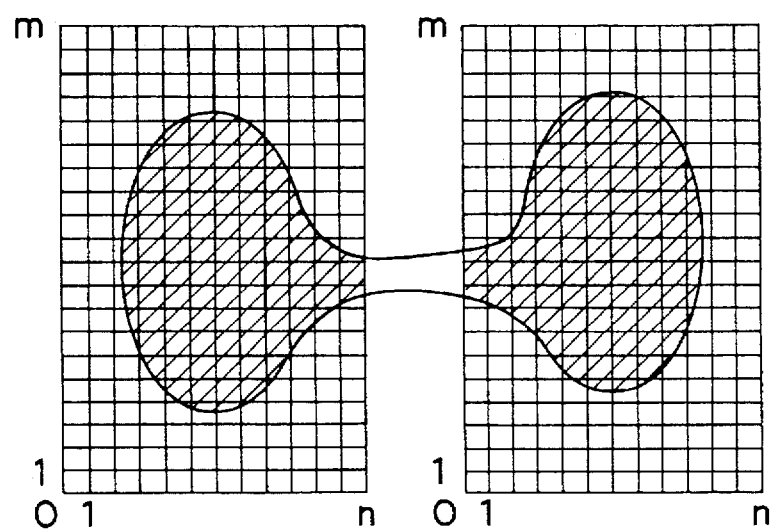
FIG. 13 is a diagram showing a case where adjacent pads are connected with each other through cream solder.

Moreover, in a case of the pad shown in FIG. 13, the adjacent pads are connected with each other through cream solder. Then, if the presence of the cream solder is detected at each outermost lattice of the adjacent pads to be inspected, it can be assumed that there is a short circuit between the printed portions of the adjacent pads.

Table 1 shows an example of set reference values with respect to the items to be inspected.

calculated from the CAD data as designed values. When the position shift $\Delta X$, $\Delta Y$ and the rotary shift $\Delta \theta$ are generated, the value $G_{(x,y)}$ of the center of gravity as a measured value is defined. That is, $$f \begin{pmatrix} \Delta X \\ \Delta Y \\ \Delta \theta \end{pmatrix}$$

is considered as coordinate transformation, it is obvious that the following expression is held:

$$f \begin{pmatrix} 0 \\ 0 \\ 0 \end{pmatrix} = 1.$$

The allowable region of the printing state is finally decided by the subsequent component-mounting process or poor connection or short circuit after a reflow process. When the solder material is changed, it is necessary to change the allowable region.

Finally, the rotary body 20a of the supporting device 20 is turned 90°, whereby the board-fixed table 21 at the inspecting position D is returned back to the fixing position A. When the board-fixed table 21 comes back to the fixing position A, the table 21 releases the circuit board 2 from the fixed state, and the circuit board 2 is fed to the discharge device 23. The circuit board 2 is transferred by the discharge device 23 to a next step for a treatment in accordance with the inspecting result (a discharging step #25 in FIG. 14).

In the above-described fixing position A, recognizing position B, printing position C, and inspecting position D, every operation (to carry-in/out feed/discharge the circuit board, to support and fix the circuit board, to recognize the relative position of the board, to print the cream solder, and to inspect the printing state) is concurrently carried out. Moreover, if the controlling part decides that the printing state of the cream solder detected by the inspecting device 26 is shifted from the optimum state, the inspecting result is fed back by the controlling part in the printing step and

TABLE 1

| ITEMS TO BE INSPECTED | ITEMS TO BE MEASURED | | REFERENCE VALUE |
|---|---|---|---|
| AREA VALUE S | $S = \sum_{j=1}^{m} \sum_{i=1}^{n} S_{ij}$ | | OPENING AREA OF MASK $S_0$ |
| VOLUME VALUE V | $V = \sum_{j=1}^{m} \sum_{i=1}^{n} S_{ij} * H_{ij}$ | | $V_0 = S_0 * H_0$ |
| FILM AVERAGE THICKNESS VALUE $\bar{H}$ | $\bar{H} = V/S$ | | MASK THICKNESS $H_0$ |
| POSITION SHIFT | $\Delta X$ $\Delta Y$ | CENTER OF GRAVITY $G_{(x,y)}$, | CENTER OF GRAVITY $G_{(x0,y0)}$ |
| ROTATION SHIFT | $\Delta \theta$ | $G_{(x,y)} = G_{(x_0,y_0)} f \begin{pmatrix} \Delta X \\ \Delta Y \\ \Delta \theta \end{pmatrix}$ | CAD DATA COORDINATE VALUE |

The reference value of the area value is an area of the openings of the mask. The reference value of the film average thickness value is a mask thickness. The reference values for calculating the position shift and rotation shift are values of the center of gravity in the CAD coordinate accordingly the printing device 25 is corrected to achieve printing in the optimum state. The mask 3 is suitably cleaned or exchanged.

Table 2 shows a method for making corrections based on a feedback-control.

TABLE 2

| ITEMS TO BE INSPECTED | INSPECTION RESULT | METHOD FOR CORRECTION FEEDBACK |
|---|---|---|
| AREA VALUE S | $S > S_0$ | MAKING GAP BETWEEN MASK AND BOARD-FIXED TABLE SMALL |
|  | $S < S_0$ | REDUCING MOVING SPEED OF SQUEEGEE UNIT |
| VOLUME VALUE V | $V > V_0$ | DECIDING METHOD |
|  | $V < V_0$ | DEPEND ON VALUES OF S AND $\bar{H}$ |
| FILM AVERAGE THICKNESS VALUE $\bar{H}$ | $\bar{H} > H_0$ | INCREASING SQUEEGEE PRINTING PRESSURE |
|  | $\bar{H} < H_0$ | DECREASING SQUEEGEE PRINTING PRESSURE |
| POSITION SHIFT $\Delta X$ $\Delta Y$ ROTATION SHIFT $\Delta\theta$ | $\Delta X, \Delta Y, \Delta\theta$ | MAKING CORRECTION AT POSITIONING OF MASK AND BOARD-FIXED TABLE |
| SHORT CIRCUIT | GENERATION | CLEANING MASK |

When the area value is larger than its reference value, it may be considered that there is an excessive gap between the mask and the circuit board and thus the cream solder is spread. Therefore, such a correction is made to reduce the gap between the mask and the board-fixed table. When the area value is smaller than its reference value, it may be considered that the openings of the mask is not sufficiently filled with the cream solder. Therefore, the moving speed of the squeeze unit (squeegee) is reduced so as to fill the openings of the mask with the larger amount of the cream solder. When the average thickness value is larger than a reference value, the material which is not removed by the squeeze unit is left and therefore, in order to remove this defect, the printing pressure is increased. When the average thickness value is smaller than the reference value, the material printed onto the circuit board is removed by the squeeze unit and therefore, in order to remove this defect, the printing pressure is decreased. With respect to the position shift and rotation shift, suitable correction is made when the mask is positioned on the board-fixed table. When it is decided that there is a short circuit, the mask is cleaned.

As described hereinabove, since the rotary body 20a of the supporting device 20 is turned while the circuit board 2 is kept fixed to the board-fixed table 21, each of the above processes is continuously carried out without interruption and each of the feeding and discharging of the circuit board 2 is completed in one operation. As a result of this, the transferring time of the board 2 is reduced and the transferring space is eliminated. Moreover, only one positioning operation of the circuit board 2 on the board-fixed table 21 is necessary and, printing and inspection of the circuit board 2 are made in the same positioned state, so that the positioning accuracy is improved. Since the above steps are concurrently carried out at the corresponding positions A–D, the working efficiency is improved.

Figure 2:
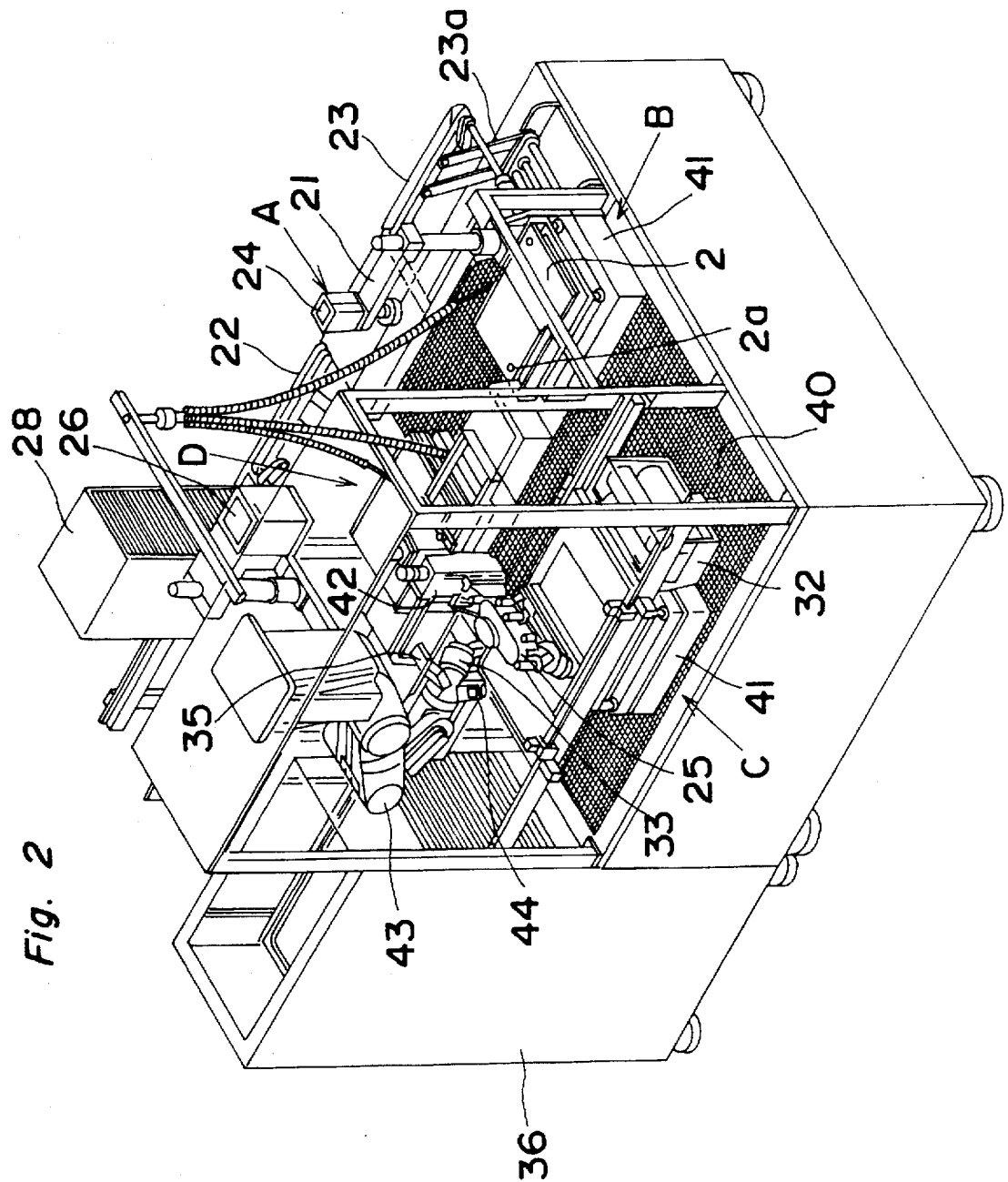
FIG. 2 is a perspective view of the whole of a cream solder printing apparatus in a second embodiment of the present invention.

FIG. 2 shows a perspective view of the whole of a cream solder printing apparatus in a second embodiment of the present invention, wherein those parts having the same function as in the first embodiment are denoted by the same reference numerals and the description thereof will be abbreviated.

The cream solder printing apparatus according to the second embodiment is constituted of a plurality of moving bodies which are independently movable on a flat plate 40 and can be positioned at an optional position. The printing apparatus is provided with a plurality of board-fixed tables 41 (three in the second embodiment) to each of which a circuit board 2 is fixed, a feed device 22 and a discharge device 23 for carrying the circuit board 2 to and from the board-fixed table 41 at a fixing position A, a recognizing device 24 for recognizing the fixed position of the circuit board 2 relative to the board-fixed table 41 at a recognizing position B, a printing device 25 for printing a printing material on the circuit board 2 secured onto the board-fixed table 41 at a printing position C, and an inspecting device 26 for inspecting the printing state of the circuit board 2 fixed to the board-fixed table 41 at an inspecting position D. The stopping positions A–D of the board-fixed table 41 on the flat plate 40 are similar to the positions A-D in the first embodiment.

The board-fixed table 41 has a stopper to stop the circuit board 2 sent by the feed device 22 at a predetermined position. Moreover, the board-fixed table 41 is provided with positioning pins which are freely movable up and down. The positioning pins are inserted into positioning holes of the circuit board 2. When the positioning pins are inserted in the holes of the circuit board 2 to thereby temporarily position the circuit board 2, suction is applied to the circuit board 2 from the rear face thereof by a suction device built in the table 41 and the circuit board 2 is securely positioned. After the circuit board 2 is sucked and fixed to the board-fixed table 41, the positioning pins are removed from the holes of the circuit board 2. The board-fixed table 41 can move a fixing part of the circuit board 2 up and down.

In the second embodiment, the feed device 22, discharge device 23, recognizing device 24, and inspecting device 26, etc. are respectively set at predetermined fixed positions. A squeegee head and the like of the printing device 25 are driven by a first robot device 42, and a clog recognizing device 44 especially for detecting clogging of the mask, an ultrasonic oscillator 33 and a mask hook 35 are activated by a second robot device 43.

Each of the board-fixed table 41, the position recognizing device 24, the printing device 25, the inspecting device 26, the first robot device 42, and the second robot device 43 performs the feedback control based on the detected data by the controlling part shown in FIG. 8.

Figure 3:
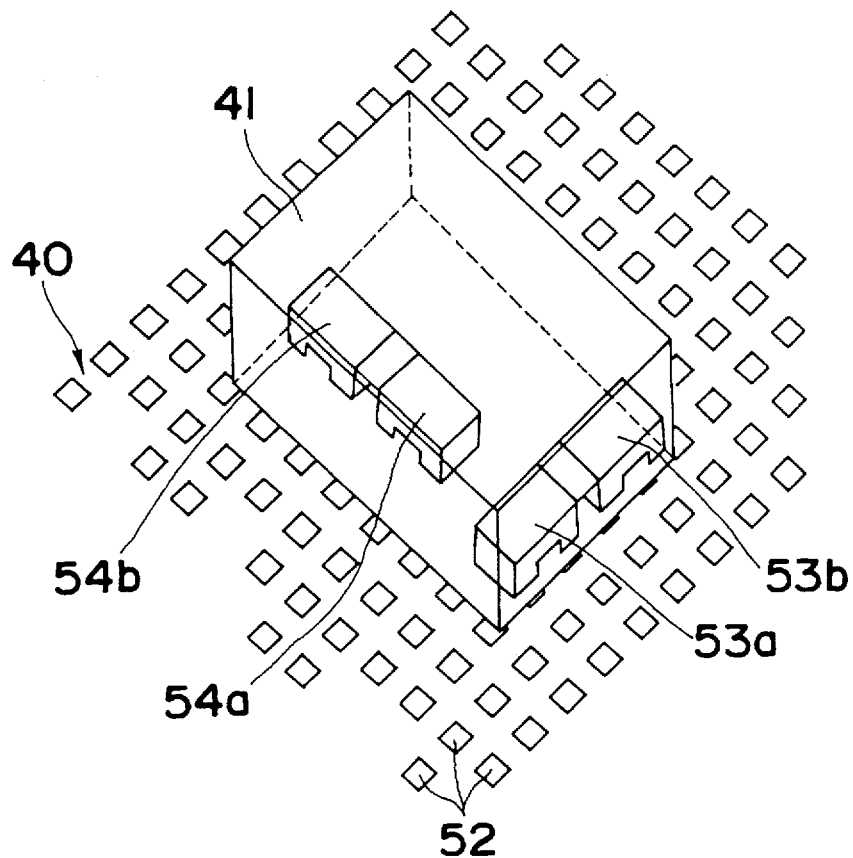
FIG. 3 is a perspective view for explaining the moving principle of a board-fixed table in the cream solder printing apparatus of FIG. 2.
Figure 4:
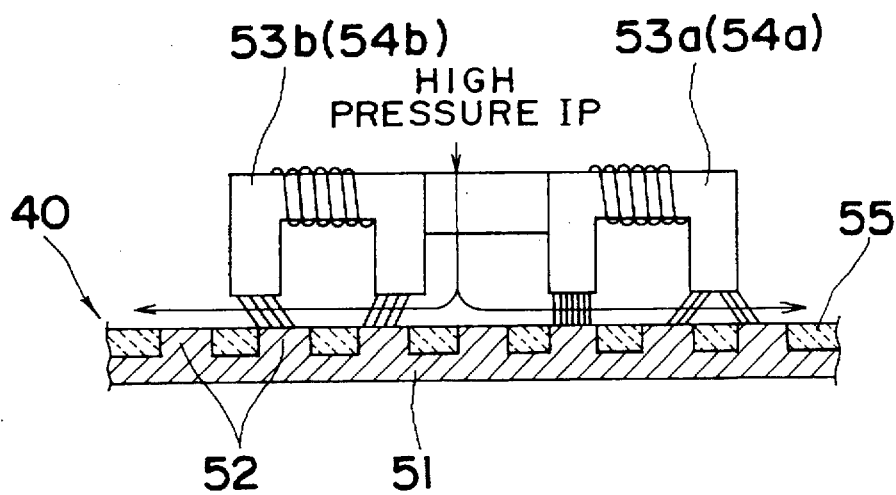
FIG. 4 is a side sectional view also for explaining the moving principle of the board-fixed table.

The board-fixed tables 41 are moved in accordance with a second-dimensional development of the moving principle of a linear motor. As indicated in FIGS. 3 and 4, many projections 52 are formed in a matrix on the surface of a magnetic plate 51 in the flat plate 40. Electromagnets 53a, 53b and 54a, 54b in pairs are aligned in parallel in the back-and-forth direction and right-and-left direction of the board-fixed table 41. The magnetic poles of the electromagnets face the projections 52 via a predetermined gap. Meanwhile, the gap of the projections 52 of the flat plate 40 is filled with synthetic resin 55 or the like, so that the surface of the flat plate 40 is formed smooth. As a high pressure air is jetted out between the surface of the flat plate 40 and the lower face of the board-fixed table 41, the board-fixed table 41 is supported in a movable fashion with a predetermined gap spaced from the flat plate 40. The electromagnets 53a, 53b, 54a, 54b are so arranged that the magnetic poles thereof are shifted in phase by half a pitch of the projections 52, and moreover, the electromagnets 53a, 53b and 54a, 54b are shifted in the same directions by ¼ the pitch. Therefore, when the electromagnets 53a, 53b or 54a, 54b are alternately activated, the board-fixed table 41 is moved at ¼ pitch intervals of the projections 52 in the back-and-forth direction or right-and-left direction to thereby be positioned at a required position.

In the above-described constitution, the printing method of the second embodiment of the present invention is carried out as follows, which is similar to the foregoing embodiment in FIG. 14.

First, the circuit board 2 carried into the fixing position A by the feed device 22 is received on the board-fixed table 41 at the fixing position A and fixed to the board-fixed table 41 (a board feeding step #21 in FIG. 14).

Next, the board-fixed table 41 is moved to the recognizing position B. The pattern 2a of the circuit board 2 is recognized by the recognizing device 24 at the recognizing position B, whereby the position of the circuit board 2 relative to the board-fixed table 41 is detected (a position recognizing step #22 in FIG. 14).

When the board-fixed table 41 is moved to the printing position C, the position of the board-fixed table 41 is corrected so as to register with the mask 3 of the printing device 25 on the basis of the detecting data by the recognizing device 24. The circuit board 2 stopped at the printing position C is raised by a lift device of the board-fixed table 41 and tightly held in touch with the mask 3. Then, a cream solder is applied onto the circuit board 2 through the openings of the mask 3 by the printing device 25. After printing of the cream solder, the circuit board 2 is lowered by the lift device and separated from the mask 3 (a printing step #23 in FIG. 14).

Subsequently, the board-fixed table 41 is moved to the inspecting position D and stopped there. At the inspecting position D, the printing state of the printed circuit board 2 is recognized and inspected by the inspecting device 26. The controlling part evaluates whether the printing state is within a preset allowance, etc. (an inspecting step #24 in FIG. 14). The method of the inspection and decision is similar to the foregoing method.

Finally, the board-fixed table 41 returns to the fixing position A and then releases the circuit board 2 from the fixed state. The circuit board 2 is supplied to the discharge device 23 which sends the board 2 to the next process for treatment corresponding to the inspecting result (a discharging step 25 in FIG. 14).

The above steps are carried out concurrently at each board-fixed table 41. Similar to the first embodiment, the printing state of the cream solder detected by the inspecting device 26 is managed by the controlling part, and the inspecting result is fed back in the printing step. Accordingly, the printing device 25 is corrected to print the cream solder in the optimum manner. Cleaning or exchanging of the mask 3 is suitably conducted. The feedback control is carried out by a method similar to the foregoing method.

As discussed hereinabove, since the board-fixed table 41 is moved on the flat plate 40 while securely holding the circuit board 2 thereon, the recognizing step, the printing step, and the inspecting step are carried out continuously, and the circuit board 2 can be fed and discharged in one respective operation. Accordingly, the feeding/discharging time of the circuit board 2 is reduced and the space for the delivery of the circuit board 2 is saved. At the same time, only one positioning operation of the circuit board 2 to the board-fixed table 41 is necessary. The circuit board 2 is printed and inspected in the same positioned state, whereby the positioning accuracy is improved. Since the above steps are concurrently processed at each stopping position A–D, the working efficiency is improved.

In the second embodiment of the present invention, there are provided three board-fixed tables 41 for parallel processing. However, the number is not limited to three, but a plurality of board-fixed tables 41 can be used or one board-fixed table may be arranged to sequentially handle the above processes.

Although the rotary body 20a of the supporting device 20 is turned at angular intervals of 90° in the first embodiment, the angle is not necessarily 90°. The rotary body 20a can be turned intermittently at other predetermined angular intervals so that the stopping position is coincident with a predetermined position, and each step is conducted at each stopping position. The mask 3 is exchanged or cleaned with ultrasonic waves and inspected as to the clogging by the robot devices 29, 34, 42, 43 smoothly.

In the above first and second embodiments, the circuit board 2 is positioned by inserting the positioning pins into the positioning holes of the circuit board 2. In an alternative arrangement, the outer periphery of the circuit board 2 can be mechanically fixed by a holding mechanism installed in the board-fixed table (for instance, suction is applied to the circuit board by a suction device while the outer periphery of the circuit board is securely held from three directions, and the holding is released afterwards). The inspecting device 26 can include one or a plurality of photographing cameras, instead of the laser oscillator.

According to an aspect of the present invention, the printing apparatus comprises: the supporting device for supporting the rotary body having, in the periphery thereof, a plurality of board-fixed tables to each of which a to-be-printed board (hereinafter referred to as "circuit board" or "board" both before and after printing thereon) is secured is turned intermittently at predetermined angular intervals around the axial center, so that the board-fixed tables are stopped at a plurality of stopping positions; the feed and discharge devices for feeding the boards to the board-fixed tables stopped at the fixing position; the recognizing device for recognizing the fixed position of the board relative to the board-fixed table at the recognizing position; the printing device for printing a printing material on the board at the printing position; and the inspecting device for inspecting the printing state of the board at the inspecting position. Since the board is fed and discharged in one respective operation, the time therefor is reduced as compared with that in the prior art arrangement, and also the space occupied is reduced. Since the board is printed and inspected in the same positioned state, the positioning accuracy is improved. Furthermore, necessary processes are concurrently handled at the stopping positions and therefore the working efficiency is improved.

According to another aspect of the present invention, the printing method comprises: the supporting step whereby the rotary body having, in the periphery thereof, a plurality of board-fixed tables to each of which a board is secured is turned intermittently every predetermined angles around the axial center, so that the board-fixed tables are stopped at a plurality of stopping positions; the feeding and discharging steps whereby the boards are fed and handed to the board-fixed tables stopped at the fixing position; the recognizing step whereby the relative fixed position of the board to the board-fixed table at the recognizing position is recognized; the printing step for printing a printing material on the board at the printing position; and the inspecting step for inspecting the printing state of the board at the inspecting position. Since the board is fed and discharged in one respective operation, the time therefor is reduced as compared with that in the prior art arrangement, and also the space occupied is reduced. Since the board is printed and inspected in the same positioned state, the positioning accuracy is improved.

Furthermore, necessary processes are concurrently handled at the stopping positions and therefore the working efficiency is improved.

In a further aspect of the present invention, the printing apparatus comprises: the board-fixed tables including moving bodies which are independently movable on a fixed plane and can be positioned at an optional position to allow the boards to be fixed thereon; the feed and discharge devices for feeding the boards to or discharging them from the board-fixed tables; the recognizing device for recognizing the fixed position of the board relative to the board-fixed table; the printing device for printing a printing material on the board fixed to the board-fixed table; and the inspecting device for inspecting the printing state of the board fixed to the board-fixed table. The same effect is attained as in the above. The processing efficiency is adjusted by increasing/decreasing the number of the board-fixed tables.

In a further aspect of the present invention, the printing method comprises: the board-fixed tables being provided with moving bodies which are independently movable on a fixed plane and can be positioned at an optional position and the fixing step for fixing the boards; the feeding and discharging steps whereby the boards are fed to or discharged for the board-fixed tables; the recognizing step whereby the fixed position of the board relative to the board-fixed table is recognized; the printing step for printing a printing material on the board fixed to the board-fixed table; and the inspecting step for inspecting the printing state of the board fixed to the board-fixed table. The same effect is attained as in the above. The processing efficiency is adjusted by increasing/decreasing the number of the board-fixed tables.

Besides, in the present invention, the data of the printing state detected by the inspecting device is fed back to control the printing device or printing step so as to achieve printing in the predetermined printing state. The optimum printing state is maintained. In the embodiments, the fixing position A and the recognizing position B can be the same position. The fixing position A and the inspecting position D can be the same position.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A printing apparatus for use in printing material in a predetermined pattern on boards, said printing apparatus comprising:

a plurality of board-securing tables to which the boards are to be respectively secured;

a rotary body supporting said board-securing tables at a plurality of angularly spaced apart positions;

a board supporting device for intermittently rotating said rotary body together with said board-securing tables so as to stop said board-securing tables at a plurality of stopping positions including a fixing position, a recognizing position, a printing position, and an inspecting position;

a board feed device for feeding the boards to said board-securing tables at said fixing position;

a board discharge device for discharging the boards from said board-securing tables at said fixing position;

a recognizing device for recognizing fixed positions of the boards relative to said board-securing tables at said recognizing position;

a printing device for printing the printing material on the boards at said printing position;

an inspecting device for inspecting, at said inspecting position, each of the boards to determine, for each of the boards, an actual total area thereof covered by the printing material printed thereon; and a controlling part for receiving area inspection data from said inspecting device representing the total area covered by the printing material printed on each of the boards, and for feedback-controlling said printing device on the basis of said area inspection data so as to provide a feedback control of said printing device which is independent of an average film thickness of the printing material printed on each of the boards.

2. A printing apparatus as recited in claim 1, wherein said inspecting device includes means for inspecting a position of the printing material printed on each of the boards; and said controlling part includes means for receiving additional inspection data from said inspecting device corresponding to the position of the printing material printed on each of the boards, and for feedback-controlling said printing device on the basis of said additional inspection data.

3. A printing apparatus as recited in claim 1, wherein said board feed device and said board discharge device are separate components.

4. A printing apparatus as recited in claim 1, wherein said rotary body supports said board-securing tables at positions angularly spaced apart by 90 degrees.

5. A printing apparatus as recited in claim 1, wherein the inspecting device includes means for inspecting, at said inspecting station, the average film thickness of the printing material printed on each of the boards.

6. A printing apparatus as recited in claim 1, wherein said board-securing tables respectively include means for moving fixing parts of the boards in X and Y and rotary directions to correct fixing positions of the boards relative to said board-securing tables, respectively.

7. A printing apparatus as recited in claim 1, wherein said inspecting device inspects each of the boards before mounting of a component thereon.

8. A printing method for printing material in a predetermined pattern on boards, said printing method comprising:

securing the boards to a plurality of board-securing tables, respectively;

supporting said board-securing tables at a plurality of angularly spaced apart positions with a rotary body;

intermittently rotating said rotary body together with said board-securing tables so as to stop said board-securing tables at a plurality of stopping positions including a fixing position, a recognizing position, a printing position, and an inspecting position;

feeding the boards to said board-securing tables at said fixing position with a board feed device;

discharging the boards from said board-securing tables at said fixing position with a board discharge device;

recognizing fixed positions of the boards relative to said board-securing tables at said recognizing position with a recognizing device;

printing the printing material on the boards at said printing position with a printing device;

inspecting, at said inspecting position each of the boards to determine an actual total area thereof covered by the printing material printed thereon with an inspecting device; and feedback-controlling said printing device on the basis of area inspection data representing the total area covered by the printing material printed on each of the boards so as to provide a feedback control of said printing device which is independent of an average film thickness of the printing material printed on each of the boards.

9. A printing method as recited in claim 8, further comprising inspecting a position of the printing material printed on each of the boards with said inspecting device; and feedback-controlling said printing device on the basis of additional inspection data corresponding to the position of the printing material printed on each of the boards.

10. A printing method as recited in claim 8, wherein said supporting comprises supporting said board-securing tables at positions angularly spaced apart by 90 degrees.

11. A printing method as recited in claim 8, further comprising inspecting with the inspecting device, at said inspecting station, the average film thickness of the printing material printed on each of the boards.

12. A printing method as recited in claim 8, further comprising moving fixing parts of the boards in X and Y and rotary directions to correct fixing positions of the boards relative to the board-securing tables, respectively.

13. A printing method as recited in claim 8, wherein said inspecting of each of the boards is carried out before mounting of a component thereon.

* * * * *